(12) United States Patent
Jansen et al.

(10) Patent No.: US 12,024,662 B2
(45) Date of Patent: Jul. 2, 2024

(54) Mn-ACTIVATED OXIDOHALIDES AS CONVERSION LUMINESCENT MATERIALS FOR LED-BASED SOLID STATE LIGHT SOURCES

(71) Applicant: LITEC-VERMÖGENSVERWAL-TUNGSGESELLSCHAFT MBH, Greifswald (DE)

(72) Inventors: Thomas Jansen, Muenster (DE); Thomas Juestel, Witten (DE); Ralf Petry, Griesheim (DE); Ingo Koehler, Darmstadt (DE); Katharina Sievert, Mesekenhagen (DE)

(73) Assignee: LITEC-VERMOGENSVERWAL-TUNGSGESELLSCHAFT MBH, Greifswald (DE)

( * ) Notice: Subject to any disclaimer, the term of this patent is extended or adjusted under 35 U.S.C. 154(b) by 955 days.

(21) Appl. No.: 16/982,994

(22) PCT Filed: Mar. 18, 2019

(86) PCT No.: PCT/EP2019/056642
§ 371 (c)(1),
(2) Date: Sep. 21, 2020

(87) PCT Pub. No.: WO2019/179907
PCT Pub. Date: Sep. 26, 2019

(65) Prior Publication Data
US 2021/0024824 A1    Jan. 28, 2021

(30) Foreign Application Priority Data
Mar. 20, 2018  (EP) ..................... 18162844

(51) Int. Cl.
| *C09K 11/68* | (2006.01) |
| *C01G 37/00* | (2006.01) |
| *C01G 39/00* | (2006.01) |
| *C01G 41/00* | (2006.01) |
| *C01G 47/00* | (2006.01) |
| *C09K 11/61* | (2006.01) |
| *H01L 33/32* | (2010.01) |
| *H01L 33/50* | (2010.01) |

(52) U.S. Cl.
CPC .......... *C09K 11/681* (2013.01); *C01G 37/006* (2013.01); *C01G 39/006* (2013.01); *C01G 41/006* (2013.01); *C01G 47/006* (2013.01); *C09K 11/613* (2013.01); *H01L 33/32* (2013.01); *H01L 33/502* (2013.01); *C01P 2002/54* (2013.01); *C01P 2002/72* (2013.01); *C01P 2002/77* (2013.01); *C01P 2006/32* (2013.01)

(58) Field of Classification Search
CPC .... C09K 11/613; C09K 11/681; H01L 33/502
See application file for complete search history.

(56) References Cited

FOREIGN PATENT DOCUMENTS

| CN | 106800930 | * | 6/2017 |
| CN | 106800930 | A | 6/2017 |
| CN | 107043624 | * | 8/2017 |
| CN | 107043624 | A | 8/2017 |

OTHER PUBLICATIONS

Jansen, et al. "Red-emitting K3HF2WO2F4:Mn4+ for application in warm-white phosphor-converted LEDs—optical properties and magnetic resonance characterization" The Royal Society of Chemistry 2019.
Liu et al., "A Red-emitting phosphor K2[MoO2F4]H20:Mn4+ for warm white light-emitting diodes with a high color rendering index" Science Direct, Materials Research Bulletin, vol. 122, Feb. 2020, 110675.
Zhang, et al. "Divalent Manganese Linked Tungsten-Molybdenum Polyoxometalates: Synthesis, Structure, and Magnetic Characteristics" Crystal Growth & Design, Bd. 7, Nr. 9, Aug. 8, 2007.
Jang et al. "Aqueous Crystallization of Manganese (II) Group 6 Metal Xodies" Chemistry of Matierals, Bd. 13, Nr. 2, , Feb. 1, 2001.
Michailovski et al. "Solvothermal Morphology Studies: Alkali and Alkaline Earth Molybdates" Helvetica Chimica Acta, vol. 87 (2004).

* cited by examiner

*Primary Examiner* — C Melissa Koslow
(74) *Attorney, Agent, or Firm* — Stuart H. Mayer; Kaplan, Breyer Schwarz LLP

(57) ABSTRACT

The present invention relates to Mn-activated luminescent materials, to a process for preparation thereof and to the use thereof as luminophores or conversion luminophores in light sources. The present invention further relates to a radiation-converting mixture comprising the luminescent material of the invention and a light source comprising the luminescent material of the invention or the radiation-converting mixture. The present invention further provides light sources, especially LEDs, and lighting units comprising a primary light source and the luminescent material of the invention or the radiation-converting mixture. The Mn-activated luminescent materials of the invention are especially suitable for creation of warm white light in LEDs.

11 Claims, 8 Drawing Sheets

Mn-ACTIVATED OXIDOHALIDES AS CONVERSION LUMINESCENT MATERIALS FOR LED-BASED SOLID STATE LIGHT SOURCES

SUBJECT-MATTER OF THE INVENTION

The present invention relates to Mn(IV)-activated luminescent materials, to a process for preparation thereof and to the use thereof as luminophores or phosphors or conversion luminophores or conversion phosphors, especially in luminophore-converted light-emitting devices such as pc-LEDs (phosphor-converted light-emitting diodes). The present invention further relates to a radiation-converting mixture comprising the luminescent material of the invention and a light source comprising the luminescent material of the invention or the radiation-converting mixture. The present invention further provides a lighting unit comprising a light source with the luminescent material of the invention or the radiation-converting mixture of the invention. The luminescent materials of the invention are especially suitable for creation of warm white light in LED solid-state light sources.

BACKGROUND OF THE INVENTION

For more than 100 years, inorganic luminophores have been developed in order to spectrally adjust emitting display screens, x-ray boosters and radiation or light sources such that they as far as possible optimally meet the demands of the respective field of use and at the same time consume a minimum amount of energy. In this context, the type of excitation, i.e. the nature of the primary radiation source, and the emission spectrum required are of crucial significance for the selection of the host lattices and the activators.

Particularly for fluorescent light sources for general lighting, i.e. low-pressure discharge lamps and light-emitting diodes, novel luminophores are constantly being developed in order to further increase energy efficiency, colour rendering and (colour locus) stability.

In order to obtain white-emitting inorganic LEDs (light-emitting diodes) via an additive colour mixture, there are three different approaches in principle:
(1) The RGB LEDs (red+green+blue LEDs), where white light is generated by mixing the light from three different light-emitting diodes that emit in the red, blue and green spectral region.
(2) The UV LED+RGB luminophore systems, in which a semiconductor that emits in the UV region (primary light source) releases the light to the environment, in which three different luminophores (conversion luminophores) are excited to emit in the red, green and blue spectral region. Alternatively, two different luminophores that emit yellow or orange and blue may be used.
(3) Complementary systems in which an emitting semiconductor (primary light source) emits blue light, for example, which excites one or more luminophores (conversion luminophores) to emit light in the yellow region, for example. Mixing of the blue and yellow light then results in white light. Alternatively, two or more luminophores that emit green or yellow and orange or red light, for example, may be used.

Binary complementary systems, when a blue-emitting semiconductor is used as primary light source, require a yellow conversion luminophore to produce white light. Alternatively, it is possible to use green- and red-emitting conversion luminophores. If, as an alternative, the primary light source used is a semiconductor that emits in the violet spectral region or in the near UV spectrum, it is necessary to use either an RGB luminophore mixture or a dichromatic mixture of two conversion luminophores that emit complementary light to obtain white light. In the case of use of a system with a primary light source in the violet or UV region and two complementary conversion luminophores, it is possible to provide light-emitting diodes with a particularly high lumen equivalent. A further advantage of a dichromatic luminophore mixture is the lower spectral interaction and the associated higher "package gain" (packing density).

Therefore, inorganic luminescent materials that can be excited in the ultraviolet and/or blue spectral region in particular are nowadays gaining ever greater importance as conversion luminophores for light sources, especially for pc-LEDs, for generation of warm white light.

There is therefore a constant need for novel luminescent materials that can be excited in the ultraviolet or blue spectral region as conversion luminophores and emit light in the visible region, especially in the red spectral region. Primary aims are therefore the extension of the product spectrum, the improvement in the colour rendering of white LEDs and the implementation of trichromatic LEDs. For this purpose, it is necessary to provide green-, yellow- and red-emitting luminophores with high absorption in the blue, violet or UV spectral region with a high quantum yield and high lumen equivalent.

Mn(IV)-activated luminescent materials are used in fluorescent light sources (CFL, TL, LED) and in emitting display screens (cathode-ray tubes) for the conversion of invisible radiation or high-energy particles to visible light. A material that has found quite broad use for this purpose is $Mg_8Ge_2O_{11}F_2$:Mn, the emission maximum of which is at about 660 nm and can be efficiently excited at 160 nm or 254 nm, or else in the deep-blue spectral region. It is therefore also suitable to some degree for use in luminophore-converted LEDs, especially since Mn(IV)-doped luminophores can also exhibit efficient photoluminescence at high temperatures (100-200° C.).

A significant disadvantage of the use of Mn(IV) activated luminophores in high-performance solid-state LED light sources is the usually relatively small absorption cross section in the near UV or blue spectral region. This finding significantly restricts the ergonomic use of Mn(IV)-activated luminophores as radiation converters in near-UV or blue LEDs.

Moreover, LEDs with high colour rendering with simultaneously high lumen yield require a red luminophore with an emission maximum in the red spectral region of 610 and 640 nm, which is possible only to a limited degree in oxidic host materials.

Therefore, the search for new Mn(IV)-activated luminophores for LEDs is still being vigorously pursued in many academic and industrial research laboratories, for example at General Electric.

For example, WO 2014/152787 A1 discloses a process for synthesis of colour-stable Mn(IV)-doped luminophores in which, for example, $K_2[SiF_6]$:$Mn^{4+}$, $K_2[TiF_6]$:$Mn^{4+}$ or $K_2[SnF_6]$:$Mn^{4+}$ as precursors in gaseous form are reacted with a fluorine-containing oxidizing agent at elevated temperature.

WO 2008/100517 A1 discloses light-emitting devices with a light source and a luminophore material, wherein the luminophore material contains a ternary Mn(IV)-activated fluoride phosphor including at least one of the following compounds: (A) $A_2[MF_5]$:$Mn^{4+}$, (B) $A_3[MF_6]$:$Mn^{4+}$, (C)

Zn$_2$[MF$_7$]:Mn$^{4+}$ or (D) A[In$_2$F$_7$]:Mn$^{4+}$ with A=Li, Na, K, Rb, Cs and/or NH$_4$ and M=Al, Ga and/or In.

Oxidic fluoride compounds with Mn(IV) activation are known from CN 106800930 A. The red luminophores consist of a material having the general formula A$_{2-x}$B$_x$(MoO$_2$F$_4$)H$_2$O:Mn$^{4+}_y$ where A and B are different and are independently Na, K, Cs or Rb; x is a value of 0 to 1; and y is a value of 0.03 to 0.16. The units of water of crystallization present in the compound, by virtue of their OH vibration, result in a multiphonon relaxation, as a result of which the luminophore is quenched. The luminophore described in CN 106800930 A thus features a low quantum yield.

Red luminophore compounds of the general formula A$_2$[MO$_2$F$_4$]:Mn$^{4+}$ are known from CN 107043624 A, where A may be Na, K, Rb or Cs; and M is Mo or W. However, these compounds are highly hygroscopic and decompose after a while under air. They additionally have a low quantum yield.

The luminescent materials known from the prior art are typically obtained by reacting a precursor compound with a fluorine-containing oxidizing agent in the gas phase at elevated temperature or in the aqueous phase. The use of such highly corrosive fluorine-containing oxidizing agents places high apparatus demands on the reaction vessel and material thereof. This makes the synthesis complex and costly.

A further disadvantage of the Mn(IV)-doped fluorides known to date is their low stability, especially in the presence of air and/or humidity or under irradiation with blue light or UV radiation. In the case of the latter, the fluorides partly release fluorine, which results in defect sites remaining in the material itself and in reduction of Mn(IV). This impairs the lifetime and stability of the luminophores and hence consequently the colour temperature of the LED.

Problem Addressed by the Invention

The problem addressed by the present invention is that of providing luminescent materials with prolonged stability, which have intense luminescence in the red spectral region and are especially suitable for use in high-performance pc-LEDs for generation of warm white light. This accords the person skilled in the art a greater selection of suitable materials for production of white-emitting devices.

The problem addressed by the present invention is thus that of providing novel luminescent materials that feature a broad absorption cross section in the near UV to blue spectral region, have an emission maximum in the red spectral region between 610 and 640 nm and are thus suitable for use as conversion luminophores in LEDs with high colour rendering. Another problem addressed by the invention is that of providing luminescent materials with high stability, long lifetime and high light conversion efficiency (quantum efficiency) that are readily obtainable by a simple and inexpensive synthesis. A further problem addressed by the present invention is that of improving the colour rendering index and the stability of the colour temperature in an LED. This makes it possible to implement warm white pc-LEDs with high colour rendering values at low colour temperatures (CCT<4000 K) with simultaneously high light yield.

DESCRIPTION OF THE INVENTION

Figure 1:
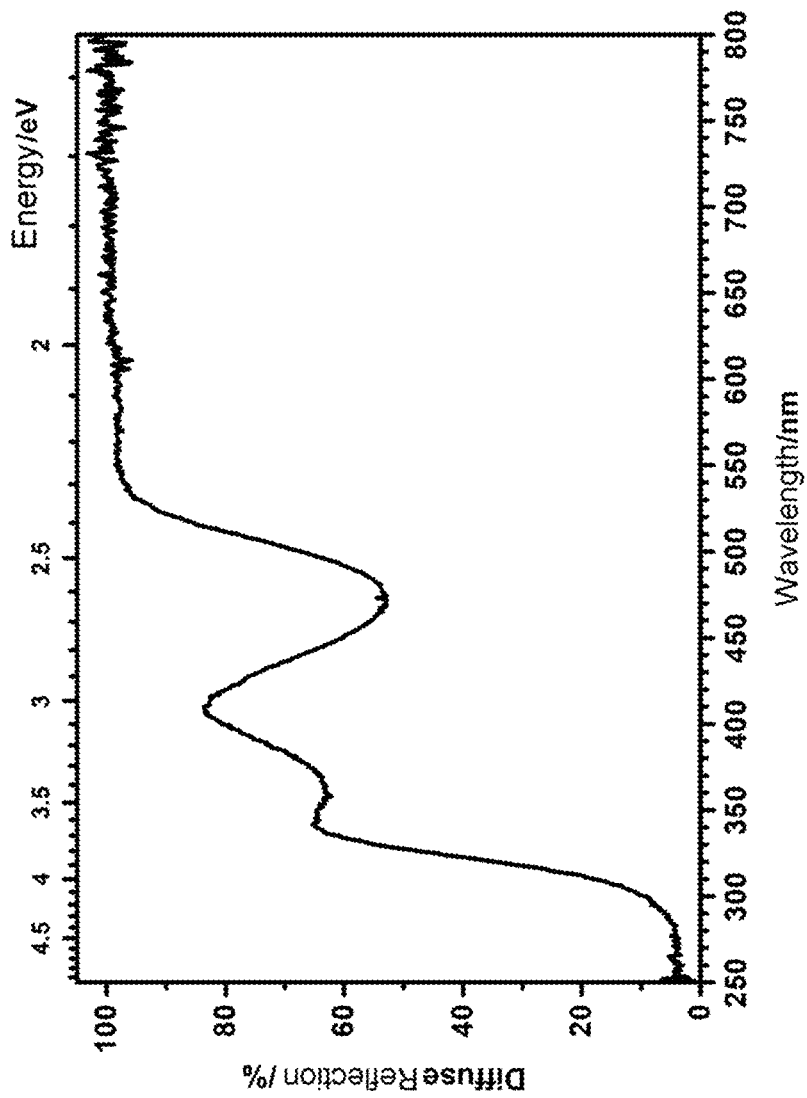
FIG. 1: Reflection spectrum of HK$_3$W$_{0.99}$Mn$_{0.01}$F$_{6.02}$O$_{1.98}$ (Example 2).
Figure 2:
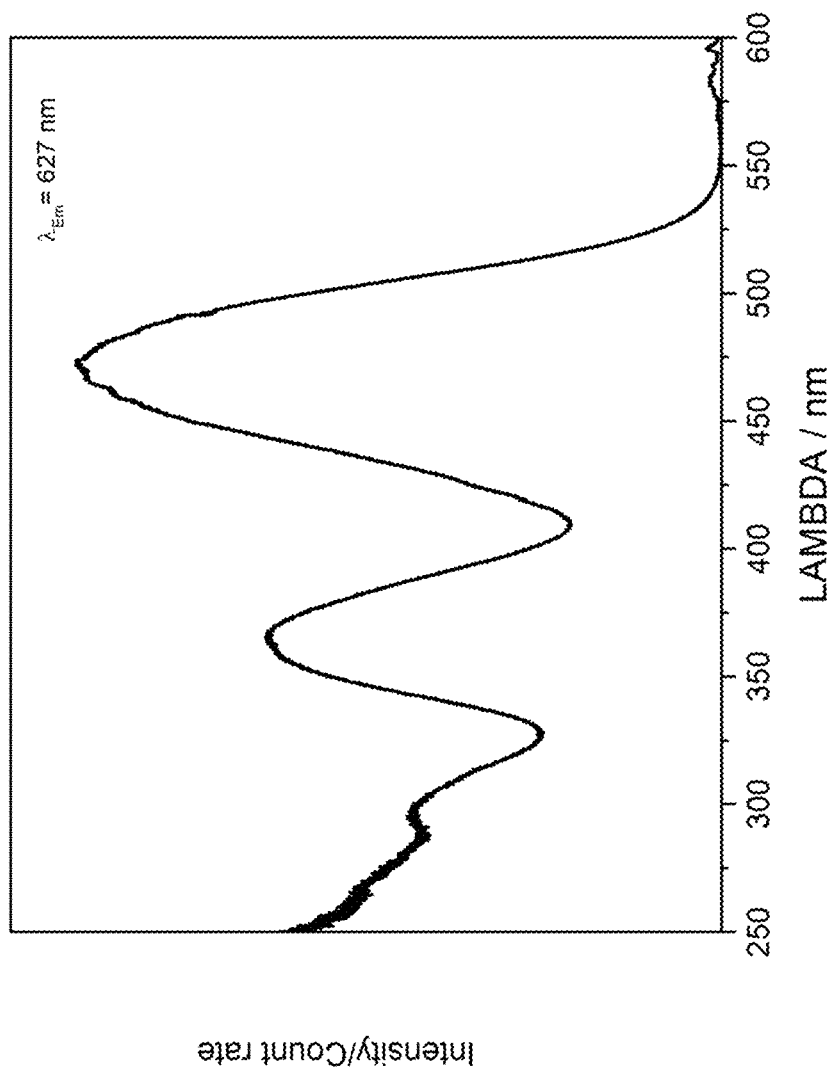
FIG. 2: Excitation spectrum of HK$_3$W$_{0.99}$Mn$_{0.01}$F$_{6.02}$O$_{1.98}$ (Example 2) ($\lambda_{em}$=627 nm).
Figure 3:
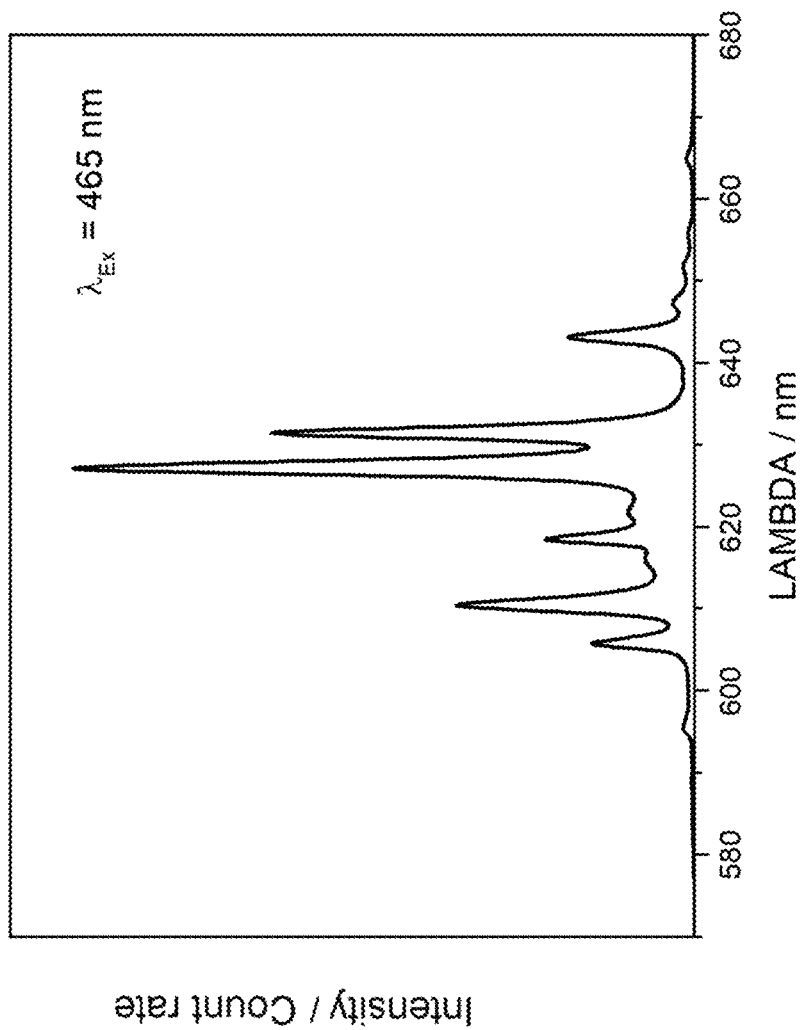
FIG. 3: Emission spectrum of HK$_3$W$_{0.99}$Mn$_{0.01}$F$_{6.02}$O$_{1.98}$ (Example 2) ($\lambda_{ex}$=465 nm).
Figure 4:
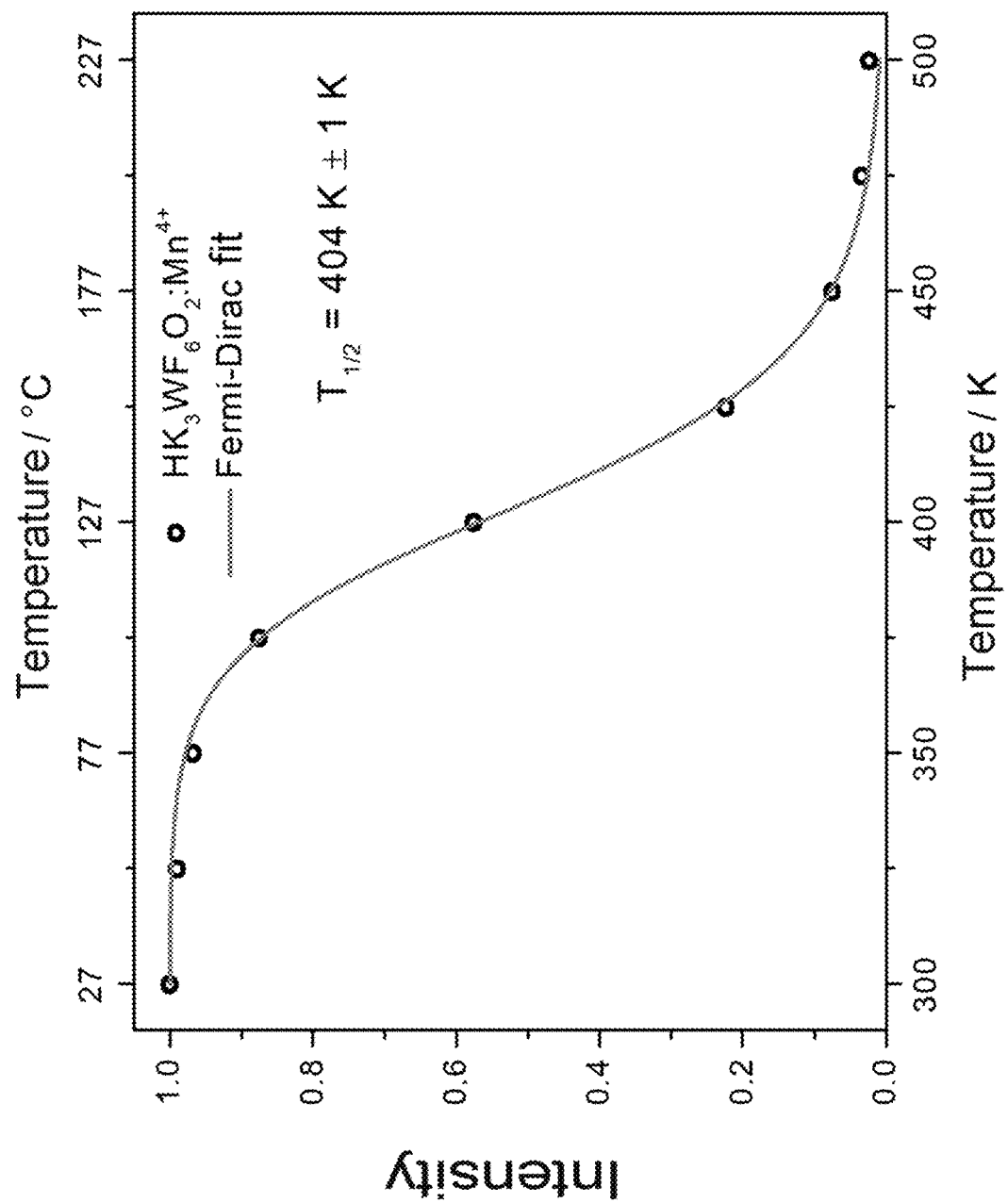
FIG. 4: Thermal quenching curve of HK$_3$W$_{0.99}$Mn$_{0.01}$F$_{6.02}$O$_{1.98}$ (Example 2) ($\lambda_{ex}$=465 nm).

It has been found that, surprisingly, the problems addressed by the present invention are solved by Mn(IV)-activated luminescent materials based on an oxidohalide host lattice of the general form: (A$_{4-a}$B$_a$)$_{m/2+n/2}$X$_{2m}$[MX$_4$O$_2$]$_n$ (with A=H and/or D, where D is deuterium; B=Li, Na, K, Rb, Cs, NH$_4$, ND$_4$ and/or NR$_4$ where R is an alkyl or aryl radical; X=F and/or Cl; M=Cr, Mo, W and/or Re; 0≤a≤4; 0<m≤10; and 1≤n≤10).

The inventors have found that, surprisingly, red-emitting luminescent materials with emission maxima in the range between 610 and 640 nm, high quantum yield, high colour rendering, long lifetime and high stability of colour temperature can be implemented by incorporating Mn(IV) ions into the oxidohalide host lattice of the general form: (A$_{4-a}$B$_a$)$_{m/2+n/2}$X$_{2m}$[MX$_4$O$_2$]$_n$ (with A=H and/or D, where D is deuterium; B=Li, Na, K, Rb, Cs, NH$_4$, ND$_4$ and/or NR$_4$ where R is an alkyl or aryl radical; X=F and/or Cl; M=Cr, Mo, W and/or Re; 0≤a≤4; 0<m≤10; and 1≤n≤10), so as to obtain compounds of the general composition:

$$(A_{4-a}B_a)_{m/2+n/2}X_{2m}[MX_4O_2]_n:Mn(IV).$$

Furthermore, the luminescent materials are obtainable efficiently and inexpensively by a simple synthesis, particular options being Cr(VI), Mo(VI), W(VI) and Re(VI) in order to obtain fluoride compounds with prolonged stability, since the corresponding octahedral oxidohalide complex anions of the general form [MX$_4$O$_2$]$^{2-}$ have exceptionally high stability. In the case of microscale powders of the luminescent materials of the invention, there is thus no grey discolouration since there is no formation of MnO$_2$. Moreover, the oxidohalides of the invention have greater stability owing to their higher lattice energy compared to fluorides. An observation made particularly in the case of tungstates is that significant π back-bonding reduces the effective ion charge density on the halide and W(VI) ions.

The tetravalent Mn(IV) ions are incorporated in the crystallographic layers of the hexavalent M ions (M=Cr(VI), Mo(VI), W(VI) and/or Re(VI)). Doping with Mn(IV) permits a simple and efficient synthesis since the Mn(IV) ions are inserted efficiently into the crystal structure of the host lattice. The charge is balanced by additional incorporation of halide and oxygen defect sites in the host lattice.

Compounds of this general composition are red-emitting Mn(IV) luminescent materials, the emission line multiplet of which in the red spectral region has a maximum between 610 and 640 nm, especially in the range between 620 and 635 nm.

Moreover, the compounds of the invention are suitable for use as conversion luminophores in solid-state radiation sources of any kind, for example solid-state LED light sources or high-performance solid-state LED light sources. The CIE1931 colour coordinates for all materials claimed here are x>0.66 and y<0.33 and the lumen equivalent is higher than 200 lm/W, preferably higher than 220 lm/W.

The present invention thus provides compounds of the following general formula (I):

$$(A_{4-a}B_a)_{m/2+n/2}X_{2m}[MX_4O_2]_n \quad (I)$$

doped with Mn(IV), where the symbols and indices used are as follows:
- A is selected from the group consisting of H and D and mixtures thereof, where D is deuterium;
- B is selected from the group consisting of Li, Na, K, Rb, Cs, $NH_4$, $ND_4$, $NR_4$ and mixtures of two or more thereof, where R is an alkyl or aryl radical;
- X is selected from the group consisting of F and Cl and mixtures thereof;
- M is selected from the group consisting of Cr, Mo, W, Re and mixtures of two or more thereof;
- $0 \leq a \leq 4$; $0 < m \leq 10$; and $1 \leq n \leq 10$.

Preferred alkyl radicals are linear C1-C5-alkyl radicals or branched C3-C5-alkyl radicals. Particularly preferred alkyl radicals are methyl, ethyl, propyl, butyl and pentyl.

Preferred aryl radicals are phenyl, naphthyl, anthryl and phenanthryl, which may optionally be substituted by one or more radicals selected from methyl, ethyl, propyl, butyl, methoxy, ethoxy, hydroxyl, fluoride, chloride and trifluoromethyl.

In the above general formula (I), A is a singly charged hydrogen and/or deuterium cation $A^+$ and B is a singly charged metal and/or ammonium cation $B^+$. M is a hextuply charged metal atom $M^{6+}$. Mn(IV) is present as a quadruply charged metal atom $Mn^{4+}$, while the halogen X is present as halide ($X^-$) and oxygen O as oxide ($O^{2-}$). The Mn(IV)-activated luminescent materials of the invention are conversion materials doped with $Mn^{4+}$, where one $Mn^{4+}$ ion and two $X^-$ ions replace one $M^{6+}$ ion and two $O^{2-}$ ions. The charge is thus balanced by the additional incorporation of two $X^-$ ions and the absence of two $O^{2-}$ ions.

The compounds of the invention are typically excitable in the spectral range from about 250 to about 550 nm, preferably from about 325 to about 525 nm, where the absorption maximum is between 425 and 500 nm, and typically emit in the red spectral region from about 600 to about 650 nm, where the emission maximum is in the range between 610 and 640 nm, preferably between 620 and 635 nm. The compounds of the invention additionally show a high photoluminescence quantum yield and have high spectral purity and high stability of colour temperature when used in an LED.

In the context of this application, ultraviolet light refers to that light having an emission maximum between 100 and 399 nm, violet light to that light having an emission maximum between 400 and 430 nm, blue light to that light having an emission maximum between 431 and 480 nm, cyan light to that light having an emission maximum between 481 and 510 nm, green light to that light having an emission maximum between 511 and 565 nm, yellow light to that light having an emission maximum between 566 and 575 nm, orange light to that light having an emission maximum between 576 and 600 nm, and red light to that light having an emission maximum between 601 and 750 nm.

In a preferred embodiment of the present invention, the Mn(IV)-doped compounds of the general formula (I) are represented by the following general formula (II):

$$(A_{4-a}B_a)_{m/2+n/2}X_{2m}[M_{1-x}X_{4+2x}O_{2-2x}]_n:[Mn(IV)_x]_n \quad (II)$$

where the symbols and indices used are as follows:
- A is selected from the group consisting of H and D and mixtures thereof, where D is deuterium;
- B is selected from the group consisting of Li, Na, K, Rb, Cs, $NH_4$, $ND_4$, $NR_4$ and mixtures of two or more thereof, where R is an alkyl or aryl radical;
- X is selected from the group consisting of F and Cl and mixtures thereof;
- M is selected from the group consisting of Cr, Mo, W, Re and mixtures of two or more thereof; and
- $0 \leq a \leq 4$; $0 < m \leq 10$; $1 \leq n \leq 10$; and $0 < x < 1.0$.

It is preferable that, for the index a in the general formulae (I) and (II): $1 \leq a \leq 4$ and more preferably $2.0 \leq a \leq 4.0$. In a preferred embodiment, a in the general formulae (I) and (II) is an integer from 1 to 4 and more preferably an integer selected from 2, 3 and 4. Most preferably, in the general formulae (I) and (II): a=3.0.

It is preferable that, for the index m in the general formulae (I) and (II): $0.1 \leq m \leq 5$, more preferably $0.5 \leq m \leq 3.0$ and most preferably $0.75 \leq m \leq 1.50$. In a preferred embodiment, m in the general formulae (I) and (II) is an integer selected from 1, 2 and 3. Most preferably, in the general formulae (I) and (II): m=1.0.

It is preferable that, for the index n in the general formulae (I) and (II): $1 \leq n \leq 5$ and more preferably $1.0 \leq n \leq 3.0$. In a preferred embodiment, n in the general formulae (I) and (II) is an integer from 1 to 5 and more preferably an integer selected from 1, 2 and 3. Most preferably, in the general formulae (I) and (II): n=1.0.

In a particularly preferred embodiment of the present invention, the Mn(IV)-doped compounds of the general formula (I) or the compounds of the general formula (II) are represented by the following general formula (III):

$$AB_3M_{1-x}X_{6+2x}O_{2-2x}:Mn(IV)_x \quad (III)$$

where A, B, X and M have one of the definitions described above for the general formula (I) and/or general formula (II) and x is as follows:

$$0 < x < 1.0.$$

Preferably, A in the general formulae (I), (II) and/or (III) is H or D, where D is deuterium; more preferably, A is H.

Preferably, B in the general formulae (I), (II) and/or (III) is selected from the group consisting of Na, K, Cs and mixtures of two or three of these; more preferably, A is selected from the group consisting of Na and K.

Preferably, X in the general formulae (I), (II) and/or (III) is F, where optionally up to 10 atom %, more preferably up to 5 atom %, of X is Cl. More preferably, X in the general formulae (I), (II) and/or (III) is F.

Preferably, M in the general formulae (I), (II) and/or (III) is selected from the group consisting of Mo, W and mixtures of Mo and W, where Cr and/or Re may optionally be present. More preferably, M in the general formulae (I), (II) and/or (III) is selected from mixtures consisting of Cr and Mo; Mo and W; Cr and W; Cr and Re; Mo and Re; W and Re; Cr, Mo and W; Cr, Mo and Re; Cr, W and Re; Mo, W and Re; and Cr, Mo, W and Re.

In a preferred embodiment of the invention, the index x in the general formulae (II) and (III) is as follows: $0 < x \leq 0.80$, more preferably 0<x≤0.60, even more preferably 0.0001<x≤0.40, especially preferably 0.001≤x≤0.20, more especially preferably 0.001≤x≤0.10 and most preferably 0.002≤x≤0.05.

In a particularly preferred embodiment of the invention, two or more of the abovementioned preferred features are applicable simultaneously, irrespective of whether they are preferred, more preferred, especially preferred and/or most preferred features.

Particular preference is therefore given to compounds of the general formulae (II) and (III) for which:
A is selected from the group consisting of H and D and mixtures thereof, where D is deuterium;
B is selected from the group consisting of Na, K, Rb and mixtures of two or three thereof;
X is F;
M is selected from the group consisting of Mo, W and mixtures of Mo and W, where Cr and/or Re may optionally be present; and
0.0001≤x≤0.40, more preferably 0.001≤x≤0.20, especially preferably 0.001≤x≤0.10 and most preferably 0.002≤x≤0.05.

In the particularly preferred compounds of the general formula (II), in addition:
1≤a≤4, more preferably 2.0≤a≤4.0 and most preferably a=3.0;
0.5≤m≤3.0, more preferably 0.75≤m≤1.50 and most preferably m=1.0; and
1≤n≤5, more preferably 1.0≤n≤3.0 and most preferably n=1.0.

The compound of the invention may preferably have been coated on its surface with another compound as described further down.

The present invention further provides a process for preparing a compound of the general formula (I), (II) and/or (III), comprising the following steps:
a) preparing a solution/suspension comprising A, B, M and Mn in an AX-containing solution;
b) stirring the suspension/solution; and
c) removing the solid obtained.

The solution/suspension is prepared in step a) by suspending/dissolving salts containing B, M and Mn in an AX-containing solution. It is possible here to add the salts in step a) either successively in any sequence or simultaneously. The salts may be added either as solids or as suspensions/solutions. The AX-containing solution used is an HX-containing solution and/or a DX-containing solution. Preferred HX-containing solutions are an HF solution and an HCl solution. Preferred DX-containing solutions are a DF solution and a DCl solution.

The HF solution used is preferably a concentrated HF solution. Preference is given to using concentrated aqueous HF solution (hydrofluoric acid) with 10-60% by weight of HF, more preferably 20-50% by weight of HF and most preferably 30-40% by weight of HF in the preparation process of the invention. The HCl solution used is preferably a concentrated HCl solution. Preference is given to using concentrated aqueous HCl solution (hydrochloric acid) with 35-37% by weight of HCl in the preparation process of the invention. A DF solution is preferably prepared from $D_2SO_4$ and $CaF_2$. The DF gas obtained is then introduced into $D_2O$, so as to obtain a DF solution. The DCl solution used is preferably a concentrated solution of 35-37% by weight of DCl in $D_2O$.

In the process for preparing a compound of the general formula (I), (II) and/or (III), in step a), salts used as starting compounds for the $B^+$ and $M^{6+}$ ions are preferably halide or oxide compounds, for example $B_2MO_4$, BX and $BHX_2$. Preferred $B_2MO_4$ compounds are: $Li_2CrO_4$, $Na_2CrO_4$, $K_2CrO_4$, $Rb_2CrO_4$, $Cs_2CrO_4$, $Li_2MoO_4$, $Na_2MoO_4$, $K_2MoO_4$, $Rb_2MoO_4$, $Cs_2MoO_4$, $Li_2WO_4$, $Na_2WO_4$, $K_2WO_4$, $Rb_2WO_4$, $Cs_2WO_4$, $Li_2ReO_4$, $Na_2ReO_4$, $K_2ReO_4$, $Rb_2ReO_4$ and $Cs_2ReO_4$. Preferred halide compounds BX are: LiF, LiCl, NaF, NaCl, KF, KCl, RbF, RbCl, $NH_4F$, $NH_4Cl$, $ND_4F$, NMI, CsF and CsCl. Preferred halide compounds $BHX_2$ are: $NaHF_2$, $KHF_2$, $RbHF_2$, $[NH_4]HF_2$, $[ND_4]DF_2$ and $CsHF_2$.

Mn is used in step a) preferably in the form of tetravalent manganese salts as starting compounds, for example $B_2MnX_6$. Preferred tetravalent manganese salts $BMnX_6$ are $Li_2MnF_6$, $Li_2MnCl_6$, $Na_2MnF_6$, $Na_2MnCl_6$, $K_2MnF_6$, $K_2MnCl_6$, $Rb_2MnF_6$, $Rb_2MnCl_6$, $Cs_2MnF_6$ and $Cs_2MnCl_6$.

The starting compounds can be suspended/dissolved at temperatures between −10 and 100° C., preferably between 0 and 50° C., more preferably between 10 and 40° C. and most preferably between 15 and 30° C.

The suspension/solution is preferably stirred in step b) at temperatures between −10 and 100° C., preferably between 0 and 50° C., more preferably between 10 and 40° C. and most preferably between 15 and 30° C. for a period of up to 10 h, preferably up to 6 h, more preferably up to 4 h and most preferably up to 3 h. Preferred periods of time for the stirring of the suspension/solution in step b) are 0.1 to 10 h, 0.5 to 6 h, 1 to 4 h and 2 to 3 h. In a preferred embodiment, the suspension/solution is stirred in step b) at a temperature between 15 and 30° C. for 2 to 3 h.

The solids obtained are removed in step c) preferably by filtering, centrifuging or decanting, more preferably by filtering through a suction filter.

In a preferred embodiment of the present invention, step c) is followed by a further step d) in which the solids obtained in step c) are washed and dried. The solids are preferably washed with an organic solvent until the solids are acid-free. Preference is given to organic aprotic solvents, for example acetone, hexane, heptane, octane, dimethylformamide (DMF) and dimethyl sulfoxide (DMSO). The solvent used for washing preferably has a temperature of −10 to 20° C.

The solids are dried in step d) preferably under reduced pressure. The drying can be effected at room temperature (20 to 25° C.) or at an elevated temperature, for example 25 to 150° C. After the drying in step d), the desired luminescent material is obtained.

In a further embodiment, the luminescent materials of the invention can be coated. Suitable coating methods for this purpose are all of those as known to the person skilled in the art from the prior art and employed for luminophores. Suitable materials for the coating are especially amorphous carbon (diamond-like carbon, DLC), metal oxides, metal fluorides and metal nitrides, especially earth metal oxides such as $Al_2O_3$, earth metal fluorides such as $CaF_2$ and earth metal nitrides such as AlN, and also $SiO_2$. The coating can be conducted here, for example, by fluidized bed methods or by wet-chemical means. Suitable coating methods are known, for example, from JP 04-304290, WO 91/10715, WO 99/27033, US 2007/0298250, WO 2009/065480 and WO 2010/075908, which are hereby incorporated by reference. The aim of the coating may firstly be a higher stability of the luminescent materials, for example to air or moisture. The aim may also be improved coupling-in and coupling-out of light by a suitable choice of the surface of the coating and of the refractive indices of the coating material.

The present invention still further provides for the use of the luminescent materials of the invention as luminophore or conversion luminophore, especially for partial or complete conversion of UV light, violet light and/or blue light to lower-energy light, i.e. to light of greater wavelength.

The compounds of the invention are therefore also referred to as luminophores.

The present invention further provides a radiation-converting mixture comprising a compound of the invention. The radiation-converting mixture may consist of one or more compounds of the invention and would thus be equivalent to the above-defined term "luminophore" or "conversion luminophore".

It is preferable that the radiation-converting mixture, as well as one compound of the invention, comprises one or more further luminescent materials. Preferred luminescent materials are conversion luminophores other than the compounds of the invention, or semiconductor nanoparticles (quantum materials).

In a particularly preferred embodiment, the radiation-converting mixture comprises a compound of the invention and a further conversion luminophore. It is very particularly preferable that the compound of the invention and the further conversion luminophore each emit light with mutually complementary wavelengths.

In an alternative particularly preferred embodiment, the radiation-converting mixture comprises a compound of the invention and a quantum material. It is very particularly preferable that the compound of the invention and the quantum material each emit light with mutually complementary wavelengths.

In a further alternative particularly preferred embodiment, the radiation-converting mixture comprises a compound of the invention, a conversion luminophore and a quantum material.

When the compounds of the invention are used in small amounts, they already give rise to good LED qualities. The LED quality is described by customary parameters, for example the colour rendering index (CRI), the correlated colour temperature (CCT), lumen equivalents or absolute lumens or the colour locus in CIE x and y coordinates.

The colour rendering index (CRI) is a unitless lighting technology parameter which is familiar to the person skilled in the art and which compares the trueness of colour reproduction of an artificial light source with that of sunlight or filament light sources (the latter two have a CRI of 100).

The correlated colour temperature (CCT) is a lighting technology parameter familiar to those skilled in the art with the unit of kelvin. The higher the numerical value, the higher the blue component of the light and the colder the white light from a synthetic radiation source appears to the observer. The CCT follows the concept of the blackbody radiator, the colour temperature of which is described by what is called the Planck curve in the CIE diagram.

The lumen equivalent is a lighting technology parameter familiar to the person skilled in the art with the unit lm/W which describes the size of the photometric luminous flux in lumen from a light source at a particular radiometric radiation power with the unit of watts. The higher the lumen equivalent, the more efficient a light source.

The luminous flux with the unit lumen is a photometric lighting technology parameter familiar to those skilled in the art which describes the luminous flux from a light source, which is a measure of the total visible radiation emitted by a radiation source. The greater the luminous flux, the brighter the light source appears to the observer.

CIE x and CIE y are the coordinates in the CIE standard colour diagram familiar to the person skilled in the art (1931 Standard Observer here), by which the colour of a light source is described.

All the parameters listed above can be calculated by methods known to the person skilled in the art from the emission spectra of the light source.

The excitability of the luminophores of the invention extends over a wide range that extends from about 250 to about 550 nm, preferably from about 325 to about 525 nm.

The present invention further provides a light source comprising at least one primary light source and at least one compound of the invention or a radiation-converting mixture of the invention. The emission maximum of the primary light source here is typically in the range from about 250 to about 550 nm, preferably in the range from about 325 to about 525 nm, with conversion of the primary radiation partly or completely to longer-wave radiation by the luminophore of the invention.

In a preferred embodiment of the light source of the invention, the primary light source comprises a luminescent indium aluminium gallium nitride, especially of the formula $In_iGa_jAl_kN$ where $0≤i$, $0≤j$, $0≤k$, and $i+j+k=1$.

The person skilled in the art is aware of possible forms of light sources of this kind. These may be light-emitting LED chips of different construction.

In a further preferred embodiment of the light source of the invention, the primary light source is a luminescent arrangement based on ZnO, TCO (transparent conducting oxide), ZnSe or SiC or else an arrangement based on an organic light-emitting layer (OLED).

In a further preferred embodiment of the light source of the invention, the primary light source is a source that exhibits electroluminescence and/or photoluminescence. In addition, the primary light source may also be a plasma source or discharge source.

Corresponding light sources of the invention are also referred to as light-emitting diodes or LEDs.

The luminescent materials of the invention may be used individually or as a mixture with suitable luminescent materials familiar to the person skilled in the art. Corresponding luminescent materials that are suitable in principle for mixtures are conversion luminophores or quantum materials.

Conversion luminophores that can be used together with the luminescent material of the invention and form the radiation-converting mixture of the invention are not subject to any particular restriction. It is therefore generally possible to use any possible conversion luminophore. The following are especially suitable: $Ba_2SiO_4:Eu^{2+}$, $Ba_3SiO_5:Eu^{2+}$, $(Ba,Ca)_3SiO_5:Eu^{2+}$, $BaSi_2N_2O_2:Eu, BaSi_2O_5:Pb^{2+}$, $Ba_3Si_6O_{12}N_2:Eu$, $Ba_xSr_{1-x}F_2:Eu^{2+}$ (with $0≤x≤1$), $BaSrMgSi_2O_7:Eu^{2+}$, $BaTiP_2O_7$, $(Ba,Ti)_2P_2O_7:Ti$, $BaY_2F_8:Er^{3+}$, $Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+},Mn^{2+}$, $CaAl_2O_4:Tb^{3+}$, $Ca_3Al_2Si_3O_{12}:Ce^{3+}$, $Ca_3Al_2Si_3O_{12}:Ce^{3+}$, $Ca_3Al_2Si_3O_{12}:Eu^{2+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+},Mn^{2+}$, $Ca_2Ba_3(PO_4)_3Cl:Eu^{2+}$, $CaBr_2:Eu^{2+}$ in $SiO_2$, $CaCl_2:Eu^{2+}$ in $SiO_2$, $CaCl_2:Eu^{2+},Mn^{2+}$ in $SiO_2$, $CaF_2:Ce^{3+}$, $CaF_2:Ce^{3+},Mn^{2+}$, $CaF_2:Ce^{3+},Tb^{3+}$, $CaF_2:Eu^{2+}$, $CaF_2:Mn^{2+}$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $CaI_2:Eu^{2+}$ in $SiO_2$, $CaI_2:Eu^{2+},Mn^{2+}$ in $SiO_2$, $CaLaBO_4:Eu^{3+}$, $CaLaB_3O_7:Ce^{3+}$, $Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+},Mn^{2+}$, $Ca_2MgSi_2O_7:Eu^{2+},Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Tl$, $CaO:Zn^{2+}$, $Ca_2P_2O_7:Ce^{3+}$, $\alpha\text{-}Ca_3(PO_4)_2:Ce^{3+}$, $\beta\text{-}Ca_3(PO_4)_2:Ce^{3+}$, $Ca_5(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta\text{-}Ca_3(PO_4)_2:Eu^{2+},Mn^{2+}$, $Ca_5(PO_4)_3F:Mn^{2+}$, $Ca_5(PO_4)_3F:Sb^{3+}$, $Ca_5(PO_4)_3F:Sn^{2+}$, $\alpha\text{-}Ca_3(PO_4)_2:Eu^{2+}$, $\beta\text{-}Ca_3(PO_4)_2:Eu^{2+}$, $Ca_2P_2O_7:Eu^{2+}$, $Ca_2P_2O_7:Eu^{2+},Mn^{2+}$, $CaP_2O_6:Mn^{2+}$, $\alpha\text{-}Ca_3(PO_4)_2:Pb^{2+}$, $\alpha\text{-}Ca_3(PO_4)_2:Sn^{2+}$, $\beta\text{-}Ca_3(PO_4)_2:Sn^{2+}$, $\beta\text{-}Ca_2P_2O_7:Sn,Mn$, $\alpha\text{-}Ca_3(PO_4)_2:Tr$, $CaS:Bi^{3+}$, $CaS:Bi^{3+},Na$, $CaS:Ce^{3+}$, $CaS:Eu^{2+}$, $CaS:Cu^+,Na^+$, $CaS:La^{3+}$, $CaS:Mn^{2+}$, $CaSO_4:Bi$, $CaSO_4:Ce^{3+}$, $CaSO_4:Ce^{3+},Mn^{2+}$, $CaSO_4:Eu^{2+}$, $CaSO_4:Eu^{2+},Mn^{2+}$, $CaSO_4:Pb^{2+}$, $CaS:Pb^{2+}$, $CaS:Pb^{2+},Cl$, $CaS:Pb^{2+},Mn^{2+}$, $CaS:Pr^{3+},Pb^{2+},Cl$, $CaS:Sb^{3+}$, $CaS:Sb^{3+},Na$, $CaS:Sm^{3+}$, $CaS:Sn^{2+}$, $CaS:Sn^{2+},F$, $CaS:Tb^{3+}$, $CaS:Tb^{3+},Cl$, $CaS:Y^{3+}$, $CaS:Yb^{2+}$, $CaS:Yb^{2+},Cl$, $CaSc_2O_4:Ce$, $Ca_3(Sc,Mg)_2Si_3O_{12}:Ce$, $CaSiO_3:Ce^{3+}$, $Ca_3SiO_4Cl_2:Eu^{2+}$, $Ca_3SiO_4Cl_2:Pb^{2+}$, $CaSiO_3:Eu^{2+}$, $Ca_3SiO_5:Eu^{2+}$, $(Ca,Sr)_3SO_5:Eu^{2+}$, $(Ca,Sr)_3MgSi_2O_8:Eu^{2+}$, $(Ca,Sr)_3MgSi_2O_8:Eu^{2+},Mn^{2+}$, $CaSiO_3:Mn^{2+},Pb$, $CaSiO_3:Pb^{2+}$, $CaSiO_3:Pb^{2+},Mn^{2+}$, $CaSiO_3:Ti^{4+}$, $CaSr_2(PO_4)_2:Bi^{3+}$, $\beta\text{-}(Ca,Sr)_3(PO_4)_2:Sn^{2+}Mn^{2+}$, $CaTi_{0.9}Al_{0.1}O_3:Bi^{3+}$, $CaTiO_3:Eu^{3+}$, $CaTiO_3:Pr^{3+}$, $Ca_5(VO_4)_3Cl$, $CaWO_4$, $CaWO_4:Pb^{2+}$, $CaWO_4:W$, $Ca_3WO_6:U$, $CaYAlO_4:Eu^3$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca,Zn,Mg)_3(PO_4)_2:Sn$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag+,Cr$, $CdS:In$, $CdS:In$, $CdS:In,Te$, $CdS:Te$, $CdWO_4$, $CsF$, $CsI$, $CsI:Na+$, $CsI:Tl$, $(ErCl_3)_{0.25}(BaCl_2)_{0.75}$, $GaN:Zn$, $Gd_3Ga_5O_{12}:Cr^{3+}$, $Gd_3Ga_5O_{12}:Cr,Ce$, $GdNbO_4:Bi^{3+}$, $Gd_2O_2S:Eu^{3+}$, $Gd_2O_2Pr^{3+}$, $Gd_2O_2S:Pr,Ce,F$, $Gd_2O_2S:Tb^{3+}$, $Gd_2SiO_5:Ce^{3+}$, $KAl_{11}O_{17}:Tl^+$, $KGa_{11}O_{17}:Mn^{2+}$, $K_2La_2Ti_3O_{10}:Eu$, $KMgF_3:Eu^{2+}$, $KMgF_3:Mn^{2+}$, $K_2SiF_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+},Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+},Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$ (with $0 \leq x \leq 1$), $(Lu,Y)_3(Al,Ga,Sc)_5O_{12}:Ce,MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBa_2(PO_4)_2:U$, $MgBaP_2O_7:Eu^{2+}$, $MgBaP_2O_7:Eu^{2+},Mn^{2+}$, $MgBa_3Si_2O_8:Eu^{2+}$, $MgBa(SO_4)_2:Eu^{2+}$, $Mg_3Ca_3(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+},Mn^2$, $MgCeAl_nO_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+},Mn^{2+}$, $Mg_2Sr(SO_4)_3:Eu^{2+}$, $Mg_2TiO_4:Mn^{4+}$, $MgWO_4$, $MgYBO_4:Eu^{3+}$, $M_2MgSi_2O_7:Eu^{2+}$ (M=Ca, Sr, and/or Ba), $M_2MgSi_2O_7:Eu^{2+},Mn^{2+}$ (M=Ca, Sr, and/or Ba), $M_2MgSi_2O_7:Eu^{2+},Zr^{4+}$ (M=Ca, Sr, and/or Ba), $M_2MgSi_2O_7:Eu^{2+},Mn^{2+},Zr^{4+}$ (M=Ca, Sr, and/or Ba), $Na_3Ce(PO_4)_2:Tb^{3+}$, $Na_{1.23}K_{0.42}Eu_{0.12}TiSi_4O_{11}:Eu^{3+}$, $Na_{1.23}K_{0.42}Eu_{0.12}TiSi_5O_{13}\cdot xH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi_4O_{10}F_2:Mn$ (with $0 \leq x \leq 2$), $NaYF_4:Er^{3+}$, $Yb^{3+}$, $NaYO_2:Eu^{3+}$, P46(70%)+P47 (30%), 6-SiAlON:Eu, $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}$ (F,Cl,Br), $SrB_4O_7:Pb^{2+}$, $SrB_4O_7:Pb^{2+}$, $Mn^{2+}$, $SrB_8O_{13}:Sm^{2+}$, $Sr_xBa_yCl_zAl_2O_{4-z}/2:Mn^{2+}$, $Ce^{3+}$, $SrBaSiO_4:Eu^{2+}$, $(Sr,Ba)_3SiO_5:Eu,(Sr,Ca)Si_2N_2O_2:Eu$, $Sr(Cl,Br,I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}:Eu^{2+}$, $Sr_wF_xB_yO_z:Eu^{2+},Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $Sr_{2-y}Ba_ySiO_4:Eu$ (where $0 \leq y \leq 2$), $SrSi_2O_2N_2:Eu$, $SrGa_2S_4:Pb^{2+}$, $SrIn_2O_4:Pr^{3+}$, $Al^{3+}$, $(Sr,Mg)_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $SrO\cdot3B_2O_3:Eu^{2+},Cl$, $\beta\text{-}SrO\cdot3B_2O_3:Pb^{2+}$, $\beta\text{-}SrO\cdot3B_2O_3:Pb^{2+},Mn^{2+}$, $\alpha\text{-}SrO\cdot3B_2O_3:Sm^{2+}$, $Sr_6P_5BO_{20}:Eu,Sr_5(PO_4)_3Cl:Eu^{2+}$, $Sr_5(PO_4)_3Cl:Eu^{2+},Pr^{3+}$, $Sr_5(PO_4)_3Cl:Mn^{2+}$, $Sr_5(PO_4)_3Cl:Sb^{3+},Sr_2P_2O_7:Eu^{2+}$, $\beta\text{-}Sr_3(PO_4)_2:Eu^{2+}$, $Sr_5(PO_4)_3F:Mn^{2+},Sr_5(PO_4)_3F:Sb^{3+}$, $Sr_5(PO_4)_3F:Sb^{3+},Mn^{2+}$, $Sr_5(PO_4)_3F:Sn^{2+}$, $Sr_2P_2O_7:Sn^{2+}$, $\beta\text{-}Sr_3(PO_4)_2:Sn^{2+}$, $\beta\text{-}Sr_3(PO_4)_2:Sn^{2+},Mn^{2+}$ (Al), $SrS:Ce^{3+}$, $SrS:Eu^{2+}$, $SrS:Mn^{2+}$, $SrS:Cu^+,Na$, $SrSO_4:Bi$, $SrSO_4:Ce^{3+}$, $SrSO_4:Eu^{2+}$, $SrSO_4:Eu^{2+}$, $(Sr,Ba)_3SiO_5:Eu^{2+}$, $SrTiO_3:Pr^{3+}$, $SrTiO_3:Pr^{3+},Al^{3+},SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+},Mn$, $YAl_3B_4O_{12}:Ce^{3+},Tb^{3+}$, $YAl_3B_4O_{12}:Eu^{3+}$, $YAl_3B_4O_{12}:Eu^{3+},Cr^{3+}$, $YAl_3B_4O_{12}:Th^{4+},Ce^{3+},Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}:Eu^{3+}$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_5O_{12}:Tb^{3+}$, $YAsO_4:Eu^{3+}$, $YBO_3:Ce^{3+}$, $YBO_3:Eu^{3+}$, $YF_3:Er^{3+}$, $Yb^{3+}$, $YF_3:Mn^{2+}$, $YF_3:Mn^{2+},Th^{4+}$, $YF_3:Tm^{3+},Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3:(Eu,Pr)$, $Y_2O_3:Bi^{3+}$, $YOBr:Eu^{3+}$, $Y_2O_3:Ce$, $Y_2O_3:Er^{3+}$, $Y_2O_3:Eu^{3+}$, $Y_2O_3:Ce^{3+},Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+},Tb^{3+}$, $YPO_4:Eu^{3+}$, $YPO_4:Mn^{2+},Th^{4+}$, $YPO_4:V^{5+}$, $Y(P,V)O_4:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S:Ag$, $Zn_{0.6}Cd_{0.4}S:Ag$, $(Zn,Cd)S:Ag,Cl$, $(Zn,Cd)S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+},Ga^{3+}$, $ZnO:Bi^{3+}$, $ZnO:Ga^{3+}$, $ZnO:Ga$, $ZnO\text{—}CdO:Ga$, $ZnO:S$, $ZnO:Se$, $ZnO:Zn$, $ZnS:Ag+,Cl^-$, $ZnS:Ag,Cu,Cl$, $ZnS:Ag,Ni$, $ZnS:Au,In$, $ZnS\text{—}CdS$ (25-75), $ZnS\text{—}CdS$ (50-50), $ZnS\text{—}CdS$ (75-25), $ZnS\text{—}CdS:Ag,Br,Ni$, $ZnS\text{—}CdS:Ag+,Cl$, $ZnS\text{—}CdS:Cu,Br$, $ZnS\text{—}CdS:Cu,I$, $ZnS:Cl^-$, $ZnS:Eu^{2+}$, $ZnS:Cu$, $ZnS:Cu^+,Al^{3+}$, $ZnS:Cu^+,Cl^-$, $ZnS:Cu,Sn$, $ZnS:Eu^{2+}$, $ZnS:Mn^{2+}$, $ZnS:Mn,Cu$, $ZnS:Mn^{2+},Te^{2+}$, $ZnS:P$, $ZnS:P^{3-},Cl^-$, $ZnS:Pb^{2+}$, $ZnS:Pb,Cu$, $Zn_3(PO_4)_2:Mn^{2+}$, $Zn_2SiO_4:Mn^{2+}$, $Zn_2SiO_4:Mn^{2+},As^{5+}$, $Zn_2SiO_4:Mn,Sb_2O_2$, $Zn_2SiO_4:Mn^{2+},P$, $Zn_2SiO_4:Ti^{4+}$, $ZnS:Sn^{2+}$, $ZnS:Sn,Ag$, $ZnS:Te,Mn$, $ZnS\text{—}ZnTe:Mn^{2+}$, $ZnSe:Cu^+,Cl$ and $ZnWO_4$.

The compounds of the invention especially show advantages when mixed with further luminophores of other fluorescence colours or when used in LEDs together with such luminophores. Preference is given to using the compounds of the invention together with green-emitting luminophores. It has been found that, especially when the compounds of the invention are combined with green-emitting luminophores, the optimization of lighting parameters for white LEDs is possible particularly successfully.

Corresponding green-emitting luminophores are known to those skilled in the art or can be selected by the person skilled in the art from the list above. Particularly suitable green-emitting luminophores here are $(Sr,Ba)_2SiO_4:Eu$, $(Sr,Ba)_3SiO_5:Eu$, $(Sr,Ca)Si_2N_2O_2:Eu$, $BaSi_2N_2O_2:Eu$, $(Lu,Y)_3(Al,Ga,Sc)_5O_{12}:Ce$, 6-SiAlON:Eu, $CaSc_2O_4:Ce$, $CaSc_2O_4:Ce,Mg$, $Ba_3Si_6O_{12}N_2:Eu$ and $Ca_3(Sc,Mg)_2Si_3O_{12}:Ce$. Particular preference is given to $Ba_3Si_6O_{12}N_2:Eu$ and $Ca_3(Sc,Mg)_2Si_3O_{12}:Ce$.

In a further preferred embodiment of the invention, it is preferable to use the compound of the invention as the sole luminophore. The compound of the invention, as a result of the broad emission spectrum with a high red component, shows very good results even when used as a single luminophore.

Quantum materials that can be used together with the luminescent material of the invention and form the radiation-converting mixture of the invention are not subject to any particular restriction. It is therefore generally possible to use any possible quantum material. Suitable quantum materials here are especially semiconductor nanoparticles with elongated, round, elliptical and pyramidal geometry that may be present in a core-shell configuration or in a core-multishell configuration. Semiconductor nanoparticles of this kind are known, for example, from WO 2005075339, WO 2006134599, EP 2 528 989 B1 and U.S. Pat. No. 8,062,421 B2, the disclosures of which are hereby incorporated by reference.

The quantum materials preferably consist of semiconductors of groups II-VI, III-V, IV-VI or I-III-VI$_2$ or any combination thereof. For example, the quantum material may be selected from the group consisting of CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AlP, AlSb, Cu$_2$S, Cu$_2$Se, CuGaS$_2$, CuGaSe$_2$, CuInS$_2$, CuInSe$_2$, Cu$_2$(InGa)S$_4$, AgInS$_2$, AgInSe$_2$, Cu$_2$(ZnSn)S$_4$, alloys thereof and mixtures thereof.

Quantum materials may also be present in the form of semiconductor nanoparticles on the surface of unactivated crystalline materials. In materials of this kind, one or more types of semiconductor nanoparticles are present on the surface of one or more kinds of unactivated crystalline materials, for example unactivated luminophore matrix materials. Materials of this kind are also referred to as quantum material on a phosphor matrix (QMOP) and are known from WO 2017/041875 A1, the disclosure of which is hereby incorporated by reference.

In yet a further embodiment of the invention, it is preferable when the luminophores are arranged on the primary light source such that the red-emitting luminophore is essentially irradiated by the light from the primary light source, while the green-emitting luminophore is essentially irradiated by the light that has already passed through the red-emitting luminophore or has been scattered thereby. This can be achieved in that the red-emitting luminophore is mounted between the primary light source and the green-emitting luminophore.

The luminophores or luminophore combinations of the invention may be in the form of bulk material, powder material, thick or thin sheet material or self-supporting material, preferably in the form of a film. In addition, it can also be embedded in an encapsulation material.

The luminophores or luminophore combinations of the invention may either be dispersed here in an encapsulation material or, given suitable size ratios, may be arranged directly atop the primary light source or else arranged at a distance therefrom, according to the application (the latter arrangement also includes "remote phosphor technology"). The advantages of remote phosphor technology are known to those skilled in the art and can be found, for example, in the following publication: Japanese Journal of Applied Physics Vol. 44, No. 21 (2005), L649-L651.

The term "encapsulation material" relates to a transparent matrix material that encapsulates the luminescent materials and radiation-converting mixtures of the invention. The transparent matrix material may be formed from a silicone, a polymer (formed from a liquid or semisolid precursor material, such as a monomer or oligomer), an epoxide, a glass or a hybrid of a silicone and an epoxide. Specific but nonlimiting examples of the polymers include fluorinated polymers, polyacrylamide polymers, polyacrylic acid polymers, polyacrylonitrile polymers, polyaniline polymers, polybenzophenone polymers, poly(methyl methacrylate) polymers, silicone polymers, aluminium polymers, polybisphenol polymers, polybutadiene polymers, polydimethylsiloxane polymers, polyethylene polymers, polyisobutylene polymers, polypropylene polymers, polystyrene polymers, polyvinyl polymers, polyvinyl butyral polymers or perfluorocyclobutyl polymers. Silicones may include gels, for example Dow Corning® OE-6450, elastomers, for example Dow Corning® OE-6520, Dow Corning® OE-6550, Dow Corning® OE-6630, and resins, for example Dow Corning® OE-6635, Dow Corning® OE-6665, Nusil LS-6143 and other products from Nusil, Momentive RTV615, Momentive RTV656 and many other products from other manufacturers. In addition, the encapsulation material may be a (poly) silazane, for example a modified organic polysilazane (MOPS) or a perhydropolysilazane (PHPS). The proportion of luminescent material or of the radiation-converting mixture, based on the encapsulation material, is preferably in the range from 1% to 300% by weight, more preferably in the range from 3% to 50% by weight.

In a further embodiment, it is preferable when the optical coupling between the luminescent material and the primary light source is achieved by means of a light-guiding arrangement. It is thus possible to install the primary light source at a central site and to optically couple it to the luminescent material by means of light-guiding devices, for example optical fibres. In this way, it is possible to position an intense primary light source at a site favourable for electrical installation and, without further electrical cabling, but merely by positioning optical fibres, to install lighting composed of luminescent materials optically coupled to the optical fibres at any desired sites.

Furthermore, the luminophore of the invention or the radiation-converting mixture of the invention may be used in a filament LED as described, for example, in US 2014/0369036 A1.

The invention further provides a lighting unit, especially for backlighting of display devices, characterized in that it comprises at least one light source of the invention, and a display device, especially liquid-crystal display device (LC display), having backlighting, characterized in that it comprises at least one lighting unit of the invention.

The average particle size of the luminophores of the invention for use in LEDs is typically between 50 nm and 30 µm, preferably between 0.1 µm and 25 µm and more preferably between 1 µm and 20 µm. The average particle size is preferably ascertained according to ISO 13320:2009 ("Particle size analysis laser diffraction methods"). The ISO standard is based on the measurement of the size distribution of particles by analysis of their light scattering properties.

For use in LEDs, the luminophores can also be converted to any desired external forms, such as spherical particles, platelets and structured materials and ceramics. These forms are encompassed in accordance with the invention by the term "shaped bodies". Preferably, the shaped body is a "luminophore body". The present invention thus further provides a shaped body comprising the luminophores of the invention. The production and use of corresponding shaped bodies is known to the person skilled in the art from numerous publications.

The compounds of the invention have the following advantageous properties:
1) The compounds of the invention have an emission spectrum with a high red component and have a high photoluminescence quantum yield.
2) The compounds of the invention have low thermal quenching. For instance, the $TQ_{1/2}$ values of the compounds of the invention are typically in the region above 400 K.
3) The high thermal stability of the compounds of the invention enables the use of the material in light sources under high thermal stress as well.
4) Moreover, the compounds of the invention feature a long lifetime and enable high colour rendering and high stability of the colour temperature in an LED. This makes it possible to implement warm white pc-LEDs with high colour rendering values at low colour temperatures (CCT<4000 K).
5) The compounds of the invention can be prepared efficiently and inexpensively via a simple synthesis.

All the embodiments described here can be combined with one another unless the respective embodiments are mutually exclusive. More particularly, in the light of the teaching of this document, it is an obvious process in the course of routine optimization to combine different embodiments described here in particular in order to arrive at a specific particularly preferred embodiment.

The examples which follow are intended to illustrate the present invention and, in particular, show the result of illustrative combinations of the embodiments of the invention described. However, they should in no way be considered to be limiting; instead, they are supposed to encourage generalization. All compounds or components that are used in the preparation are either known and commercially available or can be synthesized by known methods. The temperatures reported in the examples are always in ° C. It will also be self-evident that, both in the description and the examples, the amounts of the constituents used in the compositions will always add up to a total of 100%. Percentages should always be seen within the given context.

EXAMPLES

Test Methods

The emission spectra were recorded with a fluorescence spectrometer from Edinburgh Instruments Ltd., equipped with mirror optics for powder samples, at an excitation wavelength of 450 nm. The excitation source used was a 450 W Xe lamp. For temperature-dependent measurement of emission, the spectrometer was equipped with a cryostat from Oxford Instruments (MicrostatN2). The coolant used was nitrogen.

Reflection spectra were determined with a fluorescence spectrometer from Edinburgh Instruments Ltd. For this purpose, the samples were positioned in a $BaSO_4$-coated Ulbricht sphere and analysed. Reflection spectra were recorded within a range from 250 to 800 nm. The white standard used was $BaSO_4$ (Alfa Aesar 99.998%). A 450 W high-pressure Xe lamp served as excitation source.

The excitation spectra were recorded with a fluorescence spectrometer from Edinburgh Instruments Ltd., equipped with mirror optics for powder samples, at 550 nm. The excitation source used was a 450 W Xe lamp.

The x-ray diffractograms were recorded with a Rigaku Miniflex II, operated in Bregg-Brentano geometry, in 0.02° steps with an integration time of 1 s with Cu $K_{alpha}$ radiation.

The crystal structure analysis was conducted as follows: needle-shaped single crystals were isolated. The crystals were stuck to thin quartz fibres with beeswax. The quality of the single crystals for the intensity data collection was verified by Laue images with a Buerger camera (white molybdenum x-radiation, image plate technique, Fujifilm, BAS-1800). The datasets were measured on a diffractometer from Stoe StadiVari, which was equipped with an Mo microfocus source and a Pilatus detection system at 293 K. The temperature was controlled using a Cryostream Plus System (Oxford Cryosystems, 700 series) with an accuracy of ±0.5 K. On the basis of a Gaussian profile of the x-ray source, the scaling was conducted with a numerical absorption correction for all datasets.

Figure 5:
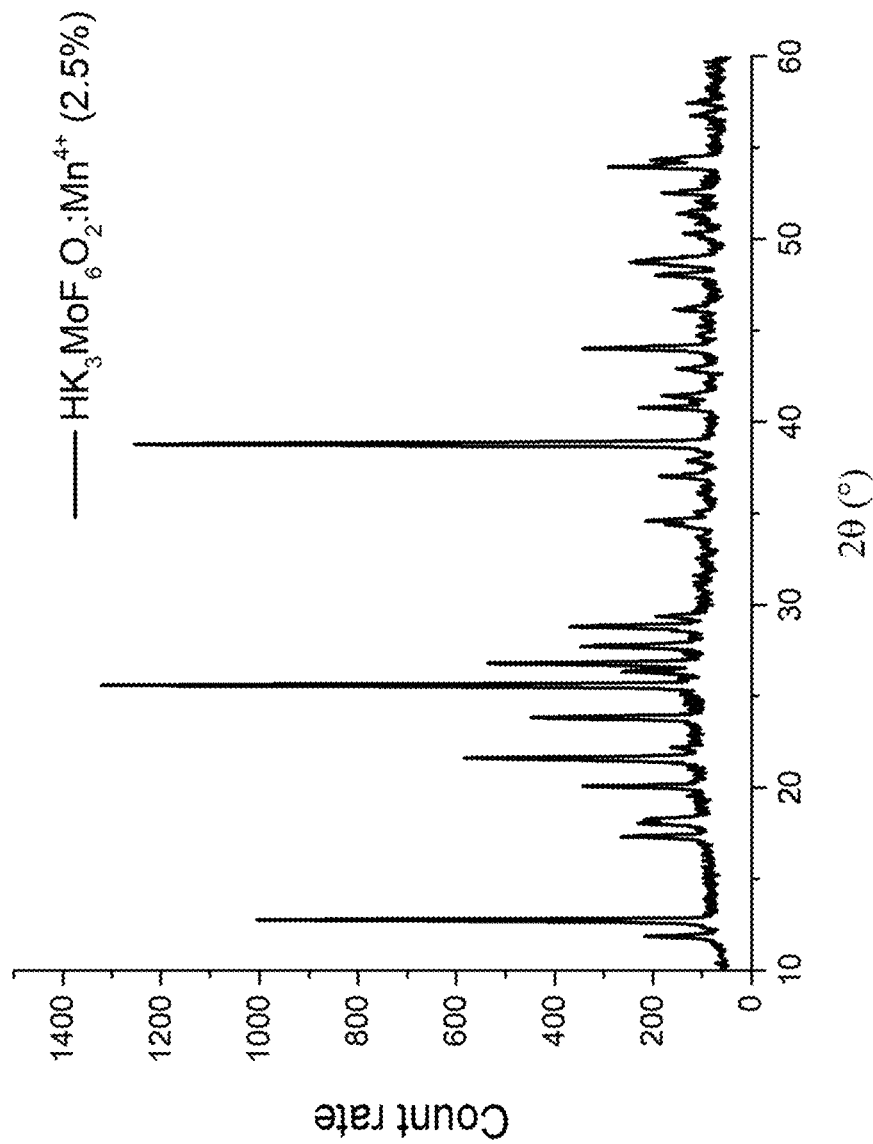
FIG. 5: X-ray powder diffractogram of HK$_3$Mo$_{0.99}$Mn$_{0.01}$F$_{6.02}$O$_{1.98}$ (Example 1)

Example 1: Preparation of $HK_3Mo_{0.99}Mn_{0.01}F_{6.02}O_{1.98}$ 6.69 g (120 mmol) of KF, 2.38 g (10.00 mmol) of $K_2MoO_4$, and 0.1234 g (0.5 mmol) of $K_2MnF_6$ were each dissolved in 3 ml of hydrofluoric acid (48% by weight). With vigorous stirring, the KF solution was first combined with the $K_2MnF_6$ solution. Thereafter, the $K_2MoO_4$ solution was slowly added dropwise. There was instantaneous formation of a yellow precipitate that conforms to the composition $HK_3Mo_{0.99}Mn_{0.01}F_{6.02}O_{1.98}$. The powder was filtered off and then washed repeatedly with cold acetone (about 0° C.). The pale yellow powder obtained was dried at 70° C. under reduced pressure for 8 h. The CIE1931 colour locus is at x=0.688 and y=0.312. The lumen equivalent is 231 lm/$W_{opt}$. FIG. 5 shows an x-ray powder diffractogram of the compound prepared.

Figure 6:
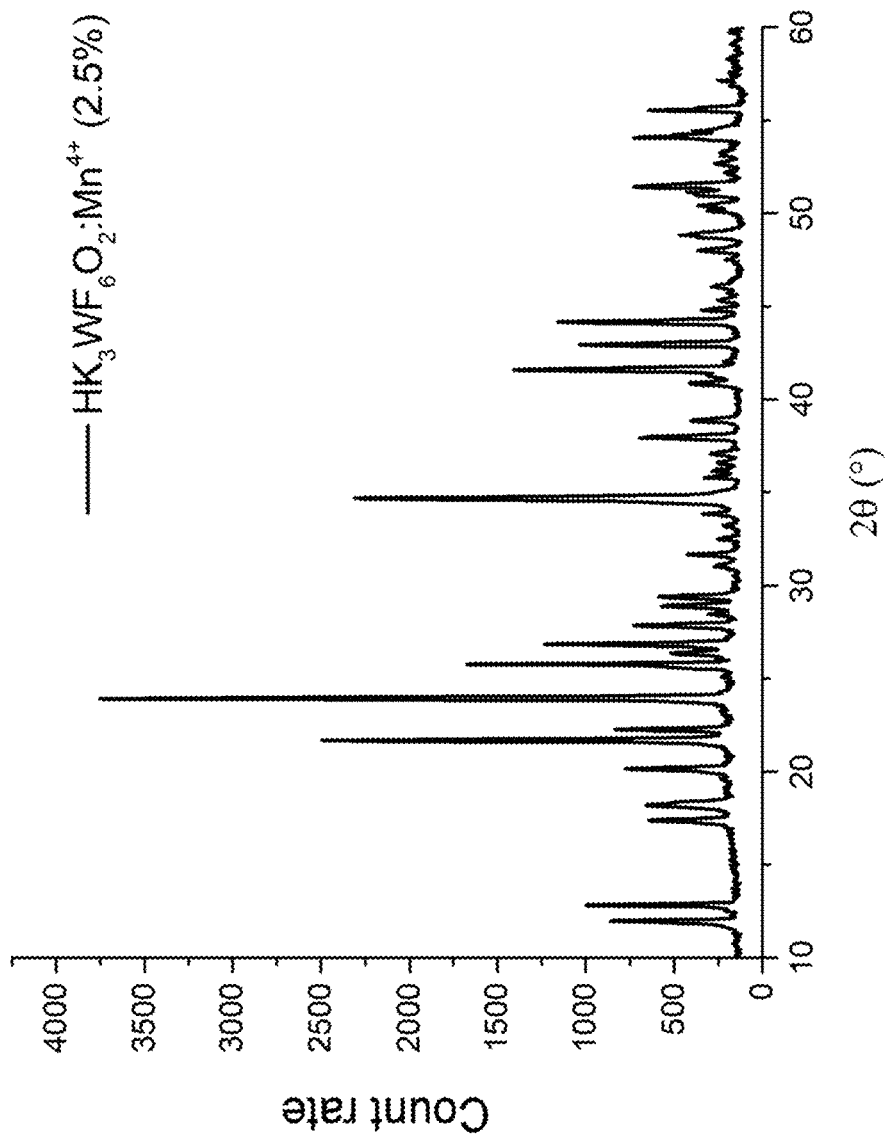
FIG. 6: X-ray powder diffractogram of HK$_3$W$_{0.99}$Mn$_{0.01}$F$_{6.02}$O$_{1.98}$ (Example 2)
Figure 7:
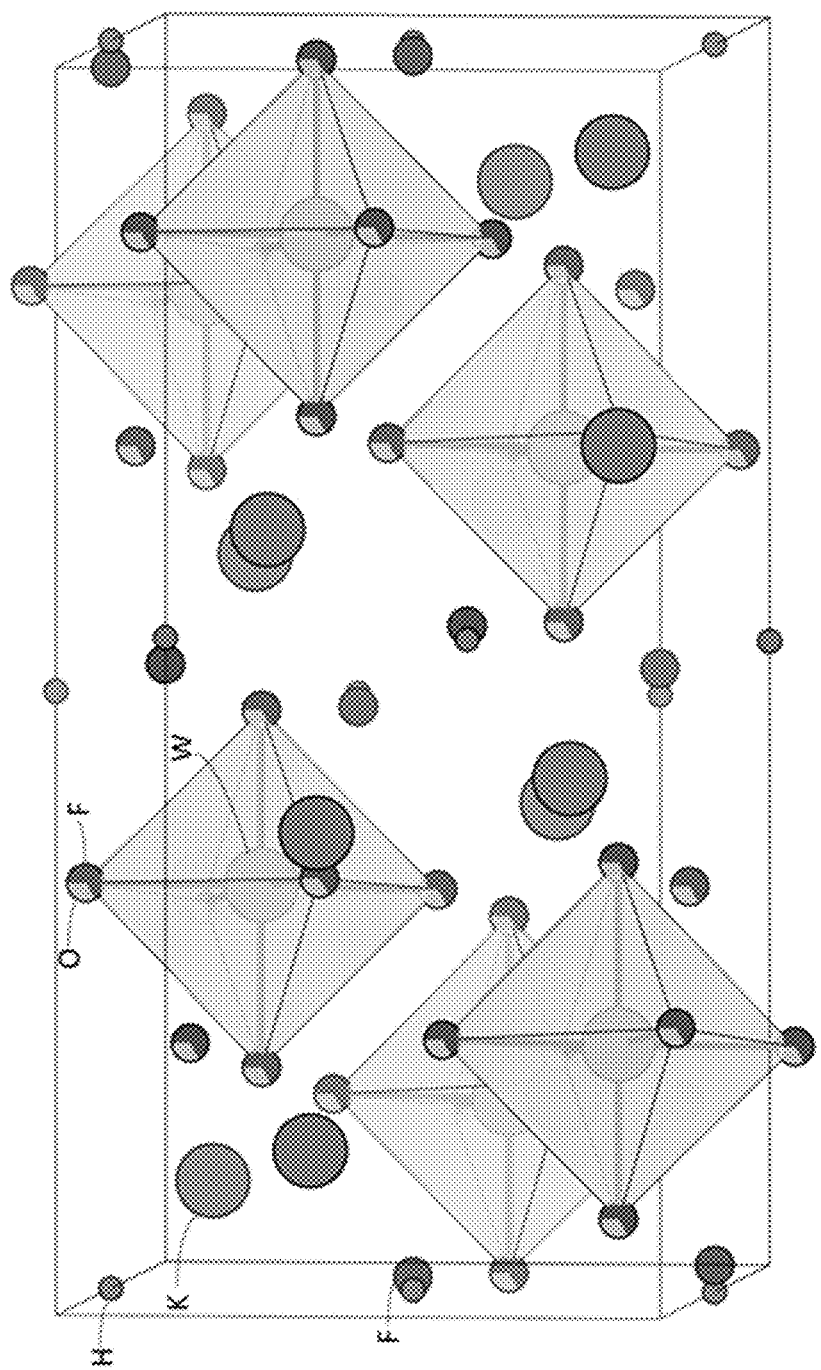
FIG. 7: Representation of the crystal structure of HK$_3$WF$_6$O$_2$:Mn (Example 2)

Example 2: Preparation of $HK_3W_{0.99}Mn_{0.01}F_{6.02}O_{1.98}$ 6.69 g (120 mmol) of KF, 3.26 g (10.00 mmol) of $K_2WO_4$, and 0.1234 g (0.5 mmol) of $K_2MnF_6$ were each dissolved in 3 ml of hydrofluoric acid (48% by weight). With vigorous stirring, the KF solution was first combined with the $K_2MnF_6$ solution. Thereafter, the $K_2WO_4$ solution was slowly added dropwise. There was instantaneous formation of a yellow precipitate that conforms to the composition $HK_3W_{0.99}Mn_{0.01}F_{6.02}O_{1.98}$. The powder was filtered off and then washed repeatedly with cold acetone (about 0° C.). The pale yellow powder obtained was dried at 70° C. under reduced pressure for 8 h. The CIE1931 colour locus is at x=0.688 and y=0.312. The lumen equivalent is 225 lm/$W_{opt}$. The reflection spectrum, excitation spectrum, emission spectrum and thermal quenching curve of the compound prepared are shown in FIGS. 1 to 4. FIGS. 6 and 7 show an x-ray powder diffractogram and a representation of the crystal structure of the compound prepared.

Example 3: Preparation of $HK_3Cr_{0.99}Mn_{0.01}F_{6.02}O_{1.98}$ 6.69 g (120 mmol) of KF, 1.94 g (10.00 mmol) of $K_2CrO_4$, and 0.1234 g (0.5 mmol) of $K_2MnF_6$ were each dissolved in 3 ml of hydrofluoric acid (48% by weight). With vigorous stirring, the KF solution was first combined with the $K_2MnF_6$ solution. Thereafter, the $K_2CrO_4$ solution was slowly added dropwise. There was instantaneous formation of a yellow precipitate that conforms to the composition $HK_3Cr_{0.99}Mn_{0.01}F_{6.02}O_{1.98}$. The powder was filtered off and then washed repeatedly with cold acetone (about 0° C.). The pale yellow powder obtained was dried at 70° C. under reduced pressure for 8 h. The CIE1931 colour locus is at x=0.688 and y=0.312. The lumen equivalent is 225 lm/W$_{opt}$.

Example 4: Preparation of HK$_3$Re$_{0.99}$Mn$_{0.01}$F$_{6.02}$O$_{1.98}$ 6.69 g (120 mmol) of KF, 1.94 g (10.00 mmol) of KReO$_4$, and 0.1234 g (0.5 mmol) of K$_2$MnF$_6$ were each dissolved in 3 ml of hydrofluoric acid (48% by weight). With vigorous stirring, the KF solution was first combined with the K$_2$MnF$_6$ solution. Thereafter, the KReO$_4$ solution was slowly added dropwise. There was instantaneous formation of a yellow precipitate that conforms to the composition HK$_3$Re$_{0.99}$Mn$_{0.01}$F$_{6.02}$O$_{1.98}$. The powder was filtered off and then washed repeatedly with cold acetone (about 0° C.). The pale yellow powder obtained was dried at 70° C. under reduced pressure for 8 h. The CIE1931 colour locus is at x=0.688 and y=0.312. The lumen equivalent is 225 lm/W$_{opt}$.

Example 5: Production and Characterization of LEDs Using the Luminescent Materials General method for preparation and analysis of pc-LEDs: A mass of m$_{LS}$ (in g) of the luminescent material listed in the respective LED example and a mass m(YAG:Ce) (available from Philips, trade name: U728) are weighed out, m$_{silicone}$ (in g) of an optically transparent silicone is added and then they are mixed homogeneously in a planetary centrifugal mixer, such that c$_{LS}$ (in % by weight) gives the concentration of the luminescent material in the overall mixture. The silicone/luminescent material mixture thus obtained is applied with the aid of an automatic dispenser to the chip of a blue semiconductor LED and cured with supply of heat. The reference LED listed for the LED characterization in the present examples was filled with pure silicone without luminescent material. The blue semiconductor LEDs used have an emission wavelength of 450 nm and are operated with a current intensity of 350 mA. The LEDs are photometrically characterized with a spectrometer from Instrument Systems—CAS 140 spectrometer and a connected ISP 250 integration sphere. The LED is characterized via the determination of the wavelength-dependent spectral power density. The spectrum of the light emitted by the LED which is thus obtained is used to calculate the colour locus coordinates CIE x and y.

Figure 8:
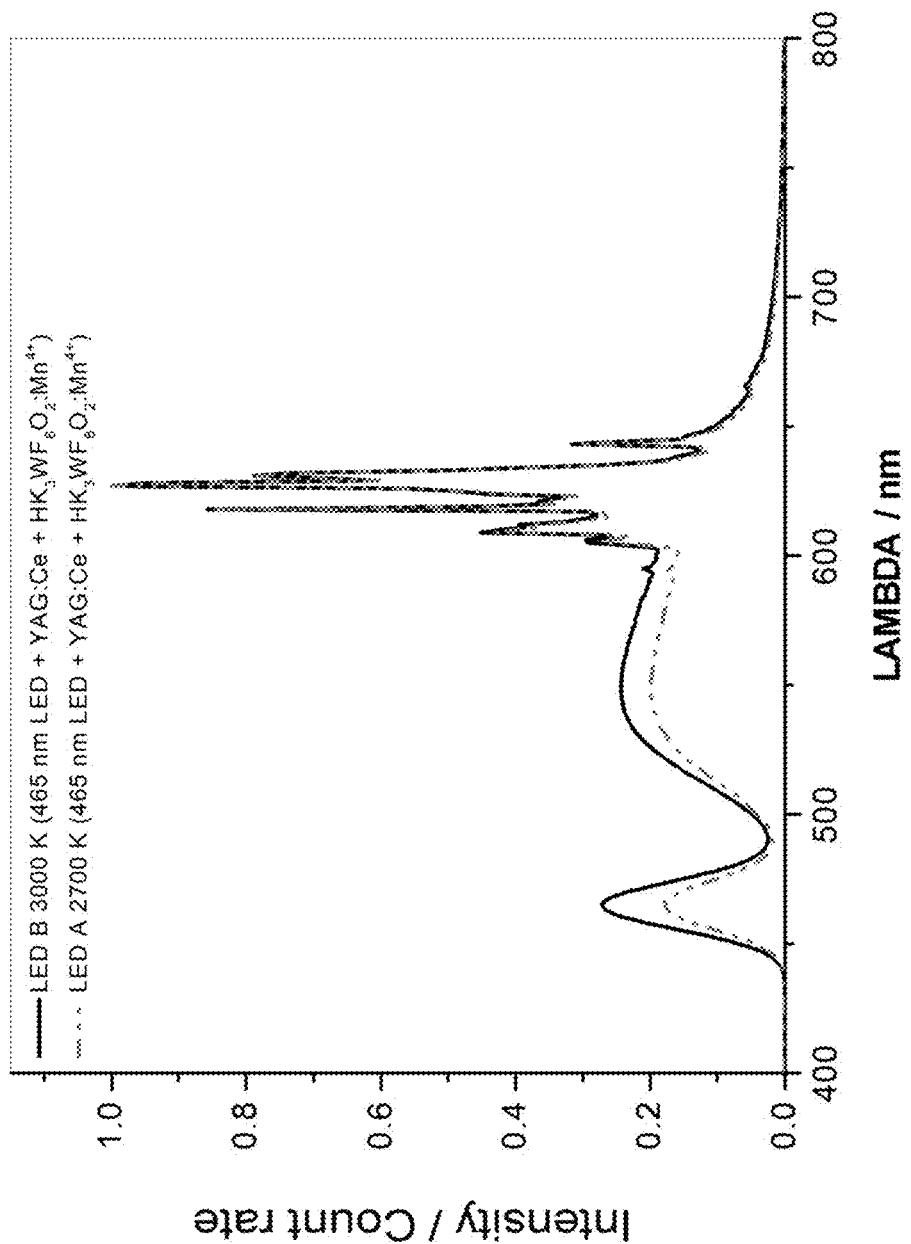
FIG. 8: Emission spectrum of LED A (dotted line) comprising YAG:Ce and HK$_3$W$_{0.99}$Mn$_{0.01}$F$_{6.02}$O$_{1.98}$ (Example 2) for colour temperature 2700 K and emission spectrum of LED B (solid line) comprising YAG:Ce and HK$_3$W$_{0.99}$Mn$_{0.01}$F$_{6.02}$O$_{1.98}$ (Example 2) for colour temperature 3000 K.

The starting weights of the luminescent materials and other materials utilized in the respective example and the colour coordinates of the LEDs obtained by the general method described above are summarized in Table 1. The corresponding LED spectra are shown in FIG. 8.

TABLE 1

Composition and properties of LED A and LED B produced.

| Parameter | LED A (2700K) with luminophore from Example 2: | LED B (3000K) with luminophore from Example 2: |
|---|---|---|
| m$_{LS}$/g | 8.43 | 6.84 |
| m(YAG:Ce) | 0.71 | 0.71 |
| c$_{YAG:Ce}$/% by wt. | 5.56 | 5.56 |
| m$_{silicone}$ | 4.46 | 4.41 |
| c$_{LS}$/% by wt. | 61.9 | 57.2 |

TABLE 1-continued

Composition and properties of LED A and LED B produced.

| Parameter | LED A (2700K) with luminophore from Example 2: | LED B (3000K) with luminophore from Example 2: |
|---|---|---|
| CIE 1931 x | 0.403 | 0.4338 |
| CIE 1931 y | 0.410 | 0.4578 |

The invention claimed is:

1. Compound of the general formula (I):

$$AB_3M_{1-x}X_{6+2x}O_{2-2x}:Mn(IV)_x \quad (I)$$

doped with Mn(IV), where the symbols and indices used are as follows:
  A is selected from the group consisting of H and D and mixtures thereof, where D is deuterium;
  B is selected from the group consisting of Li, Na, K, Rb, Cs, NH$_4$, ND$_4$, NR$_4$ and mixtures of two or more thereof, where R is an alkyl or aryl radical;
  X is selected from the group consisting of F and Cl and mixtures thereof;
  M is selected from the group consisting of Cr, Mo, W, Re and mixtures of two or more thereof;
  where x is: 0<x<1.0.

2. Compound according to claim 1, where:
  A is selected from the group consisting of H and D and mixtures thereof, where D is deuterium;
  B is selected from the group consisting of Na, K, Cs and mixtures of two or three thereof;
  X is F;
  M is selected from the group consisting of Mo, W and mixtures of Mo and W, where Cr and/or Re may optionally be present; and
  0.0001≤x≤0.40.

3. A composition comprising the compound according to claim 1, characterized in that the compound has been coated on its surface with another compound.

4. Process for preparing a compound according to claim 1, comprising the steps of:
  a) preparing a solution/suspension comprising A, B, M and Mn in an AX-containing solution;
  b) stirring the suspension/solution; and
  c) removing the solid obtained.

5. A luminophore or conversion luminophore allowing partial or complete conversion of UV light, violet light and/or blue light to light of longer wavelength, said luminophore or conversion luminophore comprising a compound according to claim 1.

6. Radiation-converting mixture comprising a compound according to claim 1.

7. Radiation-converting mixture according to claim 6, further comprising one or more further luminescent materials selected from conversion luminophores and semiconductor nanoparticles.

8. Light source comprising at least one primary light source and at least one compound according to claim 1.

9. Light source according to claim 8, wherein the primary light source comprises a luminescent indium aluminum gallium nitride.

10. Light source according to claim 9, wherein the luminescent indium aluminum gallium nitride is a compound of the formula In$_i$Ga$_j$Al$_k$N where 0≤i, 0≤j, 0≤k and i+j+k=1.

11. Lighting unit comprising at least one light source according to claim 8.

* * * * *